United States Patent
Gay

(10) Patent No.: US 7,362,589 B2
(45) Date of Patent: Apr. 22, 2008

(54) CIRCUIT BOARD ADAPTED TO COUPLE TO DIFFERENT TYPES OF ADD-IN CARDS

(75) Inventor: Raphael Gay, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 188 days.

(21) Appl. No.: 11/037,596

(22) Filed: Jan. 18, 2005

(65) Prior Publication Data

US 2006/0158864 A1    Jul. 20, 2006

(51) Int. Cl.
*H01R 12/16* (2006.01)
(52) U.S. Cl. .............. 361/785; 361/777; 361/803
(58) Field of Classification Search ........ 361/756–759, 361/803, 777; 439/59–66, 52, 637 X
See application file for complete search history.

(56) References Cited

U.S. PATENT DOCUMENTS

| | | | | |
|---|---|---|---|---|
| 4,859,190 A | * | 8/1989 | Anderson | 439/78 |
| 5,119,498 A | * | 6/1992 | McNeill et al. | 710/104 |
| 5,421,734 A | * | 6/1995 | MacWilliams | 439/59 |
| 5,440,755 A | * | 8/1995 | Harwer et al. | 710/315 |
| 5,772,453 A | * | 6/1998 | Tan et al. | 439/79 |
| 5,788,511 A | * | 8/1998 | Burnworth et al. | 439/63 |
| 5,852,725 A | * | 12/1998 | Yen | 710/301 |
| 5,930,496 A | * | 7/1999 | MacLaren et al. | 703/23 |
| 5,961,352 A | * | 10/1999 | Denny et al. | 439/637 |
| 6,147,863 A | * | 11/2000 | Moore et al. | 361/686 |
| 6,152,742 A | * | 11/2000 | Cohen et al. | 439/60 |
| 6,906,929 B2 | * | 6/2005 | Chiu | 361/788 |
| 6,930,889 B2 | * | 8/2005 | Harrison et al. | 361/774 |

* cited by examiner

Primary Examiner—Tuan T. Dinh

(57) ABSTRACT

A circuit board comprising at least one slot provided on a surface of the circuit board. An add-in card can be mated to the slot. The slot comprises a first electrical connection adapted to couple to an add-in card of a first type and a second electrical connection adapted to couple to an add-in card of a second type. The first or second types of add-in cards are different.

12 Claims, 8 Drawing Sheets

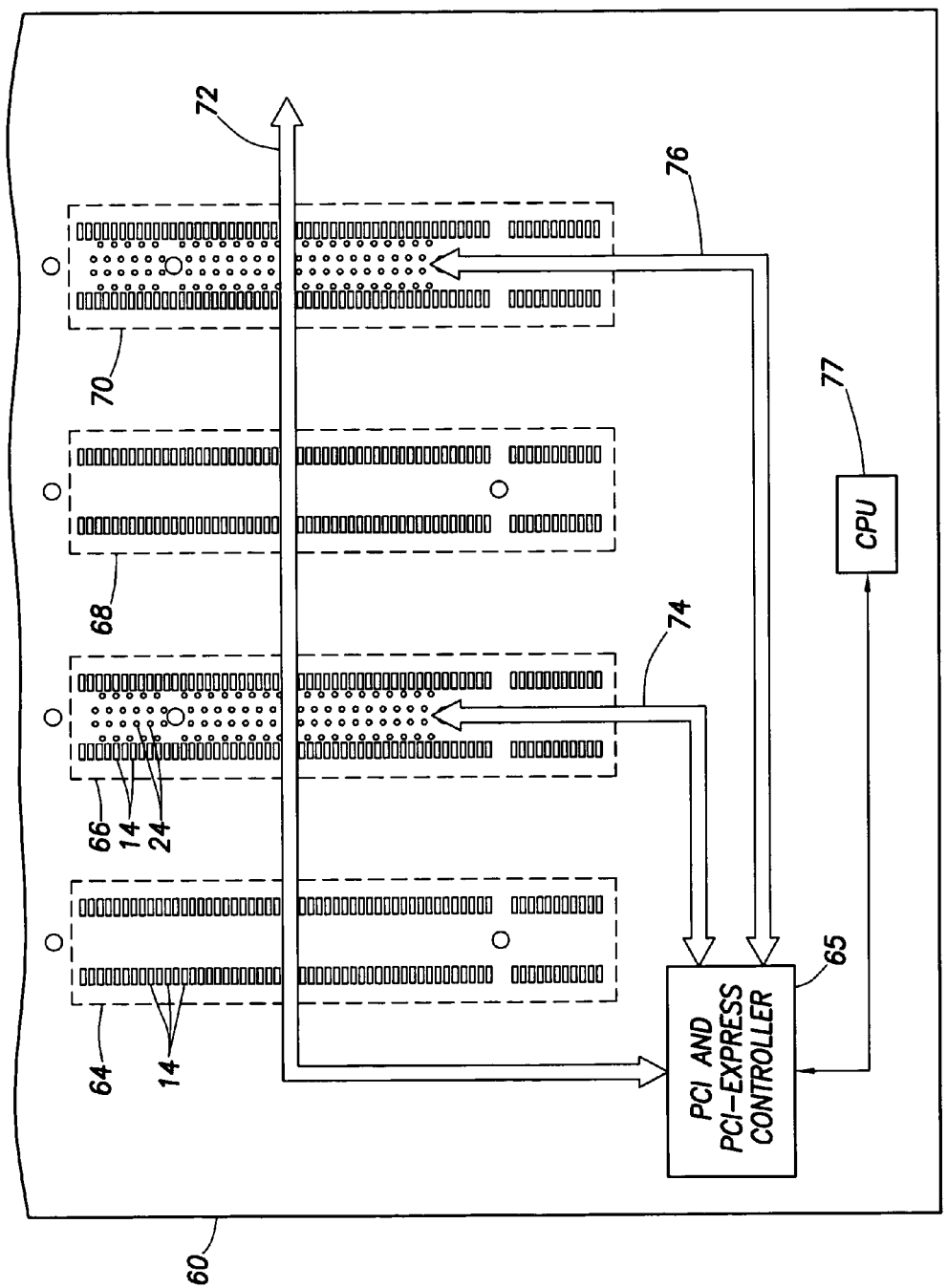

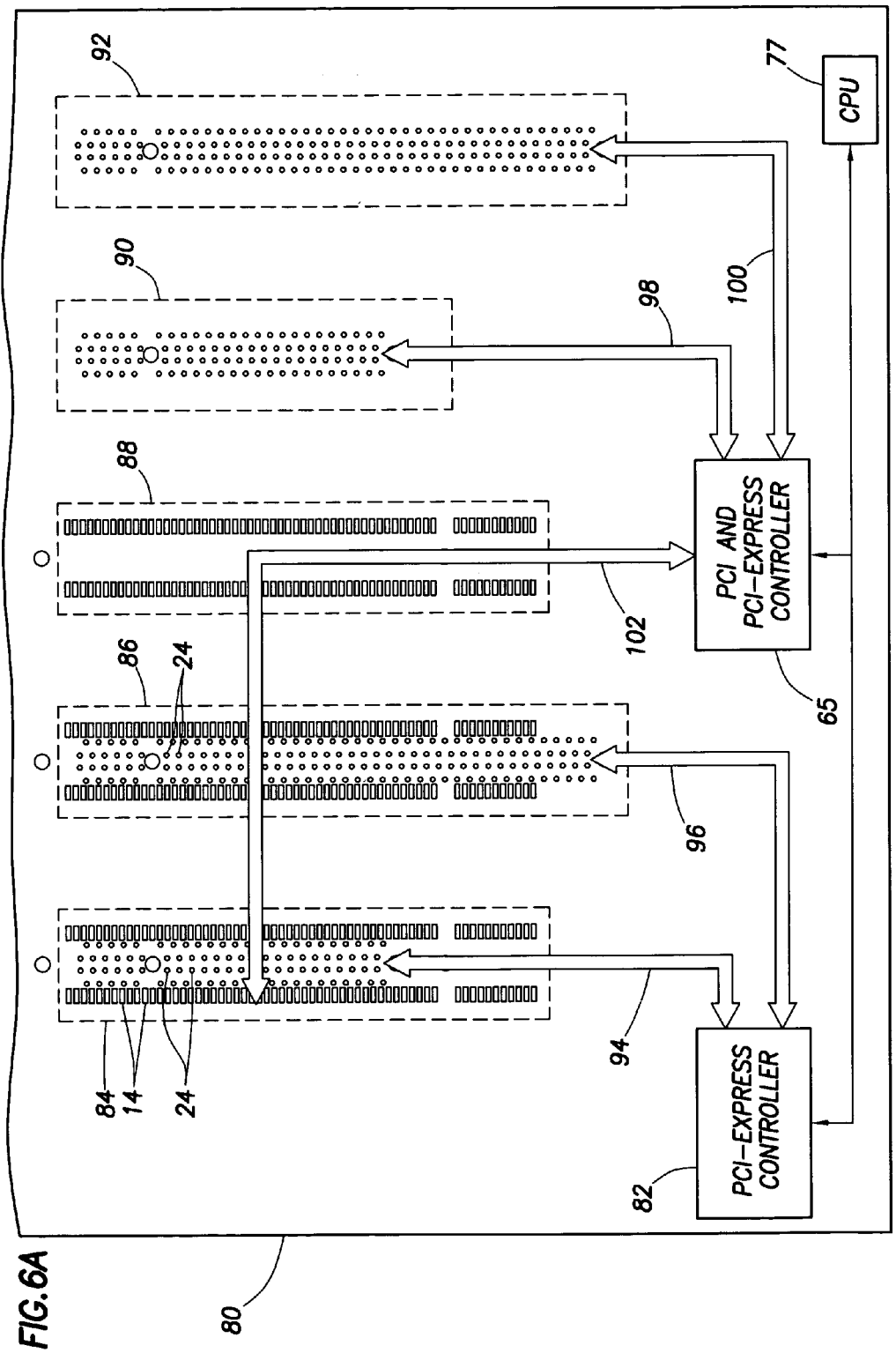

CIRCUIT BOARD ADAPTED TO COUPLE TO DIFFERENT TYPES OF ADD-IN CARDS

BACKGROUND

Many computers are equipped to accommodate one or more "add-in" cards (sometimes called "option" cards). An add-in card may be designed to provide any of a wide variety of functions such as network interface capabilities, extra memory capacity, etc. Such cards can be added to a computer by plugging the card into a slot in the computer. The computer may have one or more slots and each slot typically comprises an electrical connector on the computer's motherboard to which an add-in card may be mated. The mechanical and electrical interface between an add-in card and this host computer is typically dictated by an applicable standard. Examples of such standards include the Peripheral Component Interconnect (PCI) standard and the PCI-Express standard. The mechanical and electrical interface specified by one standard typically differs from that of other standards such that a PCI card cannot be mated to a slot designed per the PCI-Express standard, nor can a PCI-Express card be mated to PCI-compatible slot.

A computer manufacturer has to make a decision as to how many slots are to be included in a computer and the standard to which the slots are to be compatible. All of the slots can be compatible with a single standard or one or more slots could be compatible with one standard while one or more other slots could be compatible with a different standard. Purchasers/users of computers are not all in agreement as to the preferred mix of slots and standards leaving the manufacturer to predict a mix that would seem to be most widely desirable mix. Alternatively, the manufacturer might offer different platforms, each with a different mix of slots and standards. One platform might offer only PCI slots while another platform might offer only PCI-Express slots while yet another platform might provide some dedicated PCI slots and other dedicated PCI-Express slots. Providing computers with different motherboard platforms is costly and still may not be desirable to all users because some users still may want a different mix of slots than are provided in any of the various platforms.

BRIEF SUMMARY

Some embodiments comprise a circuit board having a slot on a surface of the circuit board and to which an add-in card can be mated. The slot comprises a first electrical connection adapted to couple to an add-in card of a first type and a second electrical connection adapted to couple to an add-in card of a second type. The first and second types of add-in cards are different.

BRIEF DESCRIPTION OF THE DRAWINGS

For a detailed description of exemplary embodiments of the invention, reference will now be made to the accompanying drawings in which:

FIG. 5 shows an embodiment of a circuit board comprising a plurality of slots and some of the slots include two sets of electrical connections; and FIGS. 6A-6C demonstrate the flexibility that the embodiments of the invention provide in terms of configuring each slot.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The term "system" broadly refers to a physical, electrical or operable collection of one or more components.

DETAILED DESCRIPTION

Figure 1A:
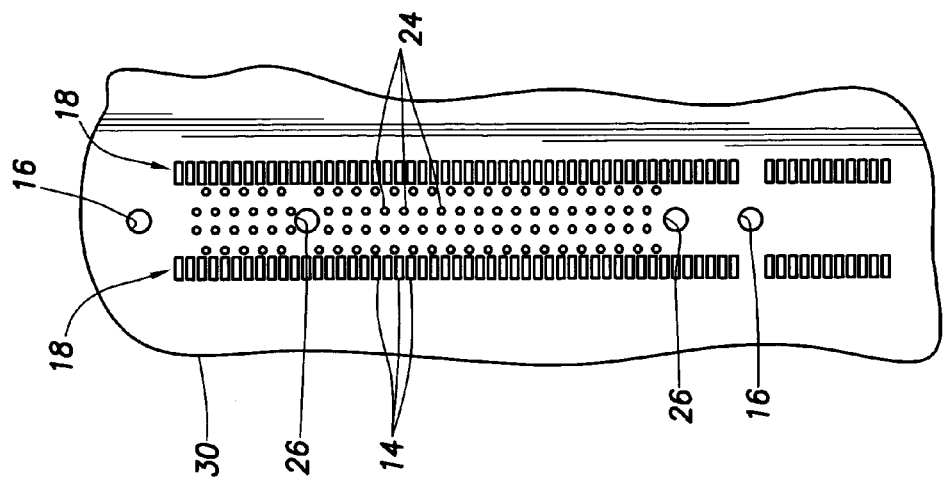
FIGS. 1a and 1b show different patterns of electrical connections on a circuit board usable in accordance with various embodiments of the invention.

FIG. 1A shows a portion of a circuit board 10. In some embodiments, the circuit board 10 comprises a system board (also referred to as a "mother board") such as is used in a computer. Various electronic devices (not specifically shown in FIG. 1A) are provided on circuit board 10 such as a processor, memory devices, bridge logic, a keyboard controller, etc. The portion of the circuit board 10 shown in FIG. 1A shows a plurality of electrical connections 14 formed on a surface 11 of the circuit board 10. The electrical connections 14 in the embodiment of FIG. 1A comprise conductive pads that are rectangularly shaped and provided on the board in two substantially parallel rows 18, thereby forming a pattern of electrical connections. The pattern of the electrical connections 14 can be any suitable pattern (not just two parallel rows) appropriate for coupling to an add-in card (shown in a subsequent figure). The pattern of electrical connections 14 shown in FIG. 1A represents a pattern that is compatible with the Peripheral Component Interconnect (PCI) specification. As such, a PCI-compatible add-in card can be coupled to the electrical connections 14 shown in FIG. 1A. In other embodiments, however, the pattern of electrical connections can be different so as to accommodate an add-in card that comports with a different standard. As will be discussed below, an electrical connector can be coupled (e.g., soldered) to the electrical connections 14 to provide a mechanism for an add-in card to be coupled to the circuit board 10. The pattern of electrical connections 14 includes a pair of mounting holes adapted to receive corresponding mechanical members (posts) from an electrical connector mated to electrical connections 14, as will be explained below.

Figure 1B:
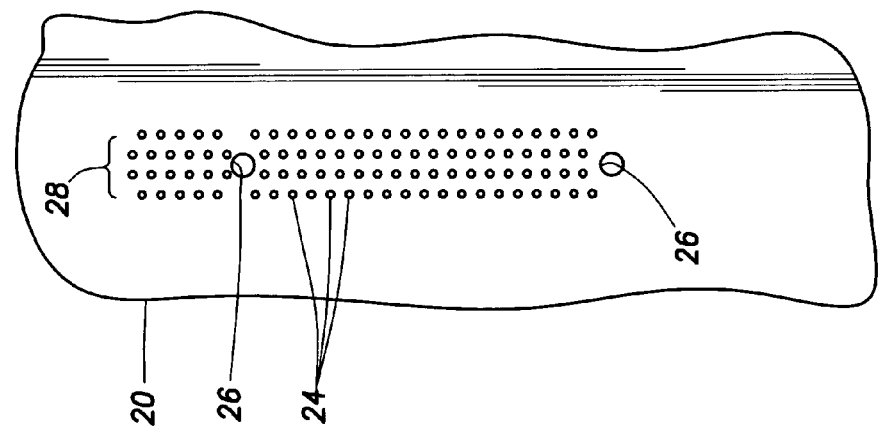

FIG. 1B shows a circuit board 20 (e.g., a system board) on which a different plurality of electrical connections 24 are provided. The pattern of electrical connections 24 in FIG. 1B comprises four separate rows 28 of electrical connections that are staggered as shown. The electrical connections 24 are "through-hole" connections meaning that the connections comprise holes formed in the circuit board 20. In some embodiments, each hole is coated with a conductive material to provide electrical connectivity between an add-in card coupled to the holes and other circuitry on the circuit board 20. The pattern of electrical connections 24 shown in FIG. 1B comports with the PCI-Express specification and thus a PCI-Express-compatible add-in card can be coupled to the plurality of electrical connections 24 shown in FIG. 1B. An electrical connector can be coupled to the connections 24 to accommodate an add-in card. The pattern of electrical connections 24 includes a pair of mounting holes 26 to receive corresponding posts from a mating connector as will be explained below.

Figure 2:
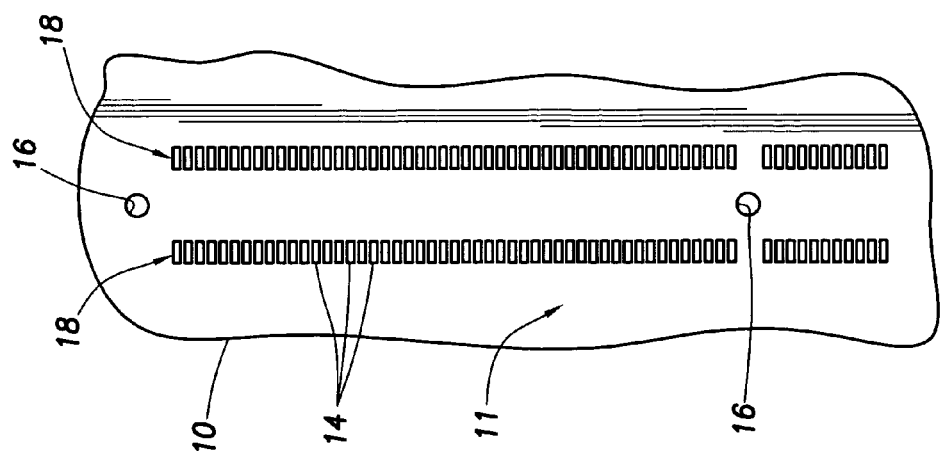
FIG. 2 shows an embodiment in which two different patterns of electrical connections are provided in one slot on a circuit board.
Figure 3:
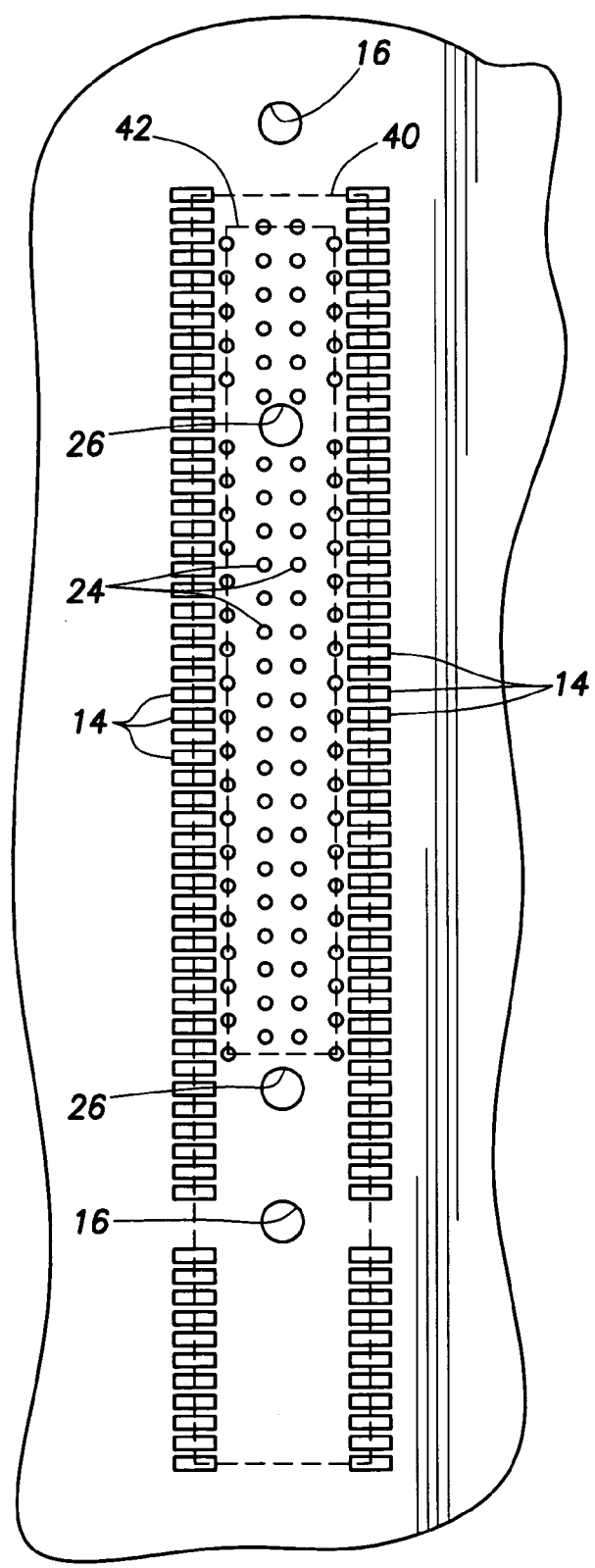
FIG. 3 illustrates that a footprint associated with one pattern of electrical connections can reside within a footprint associated with another pattern of electrical connections.

FIG. 2 shows a circuit board 30 in which the two patterns of electrical connections from FIGS. 1A and 1B are provided. In the embodiment of FIG. 2, the pattern of electrical connections 24 from FIG. 1B resides within the pattern of electrical connections 14 from FIG. 1A. This point is further illustrated in FIG. 3. As shown in FIG. 3, the pattern of electrical connections 14 define a footprint 40. Further, the pattern of electrical connections 24 define another footprint 42. The spacing of the electrical connections 14 and 24 is such that the footprint 42 of electrical connections 24 resides within the footprint 40 of the electrical connections 14. By having two patterns of electrical connections generally coincident at the same general location on the circuit board, either of two electrical connectors can be mated to one of the patterns of electrical connections depending, for example, on the type of add-in card that is desired to be used.

Figure 4A:
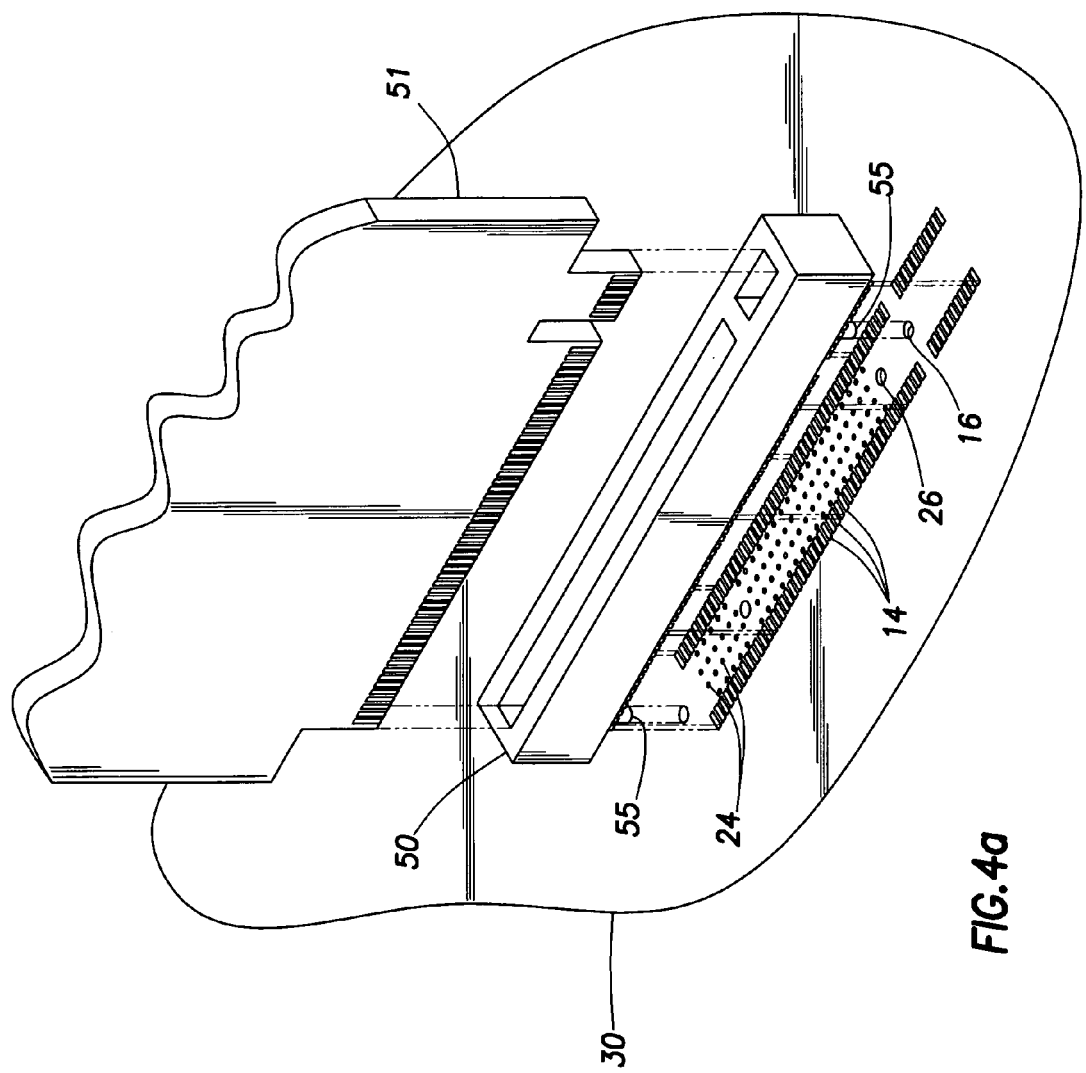
FIGS. 4A and 4B illustrate the use of electrical connectors with the various patterns of electrical connections in accordance with various embodiments of the invention.
Figure 4B:
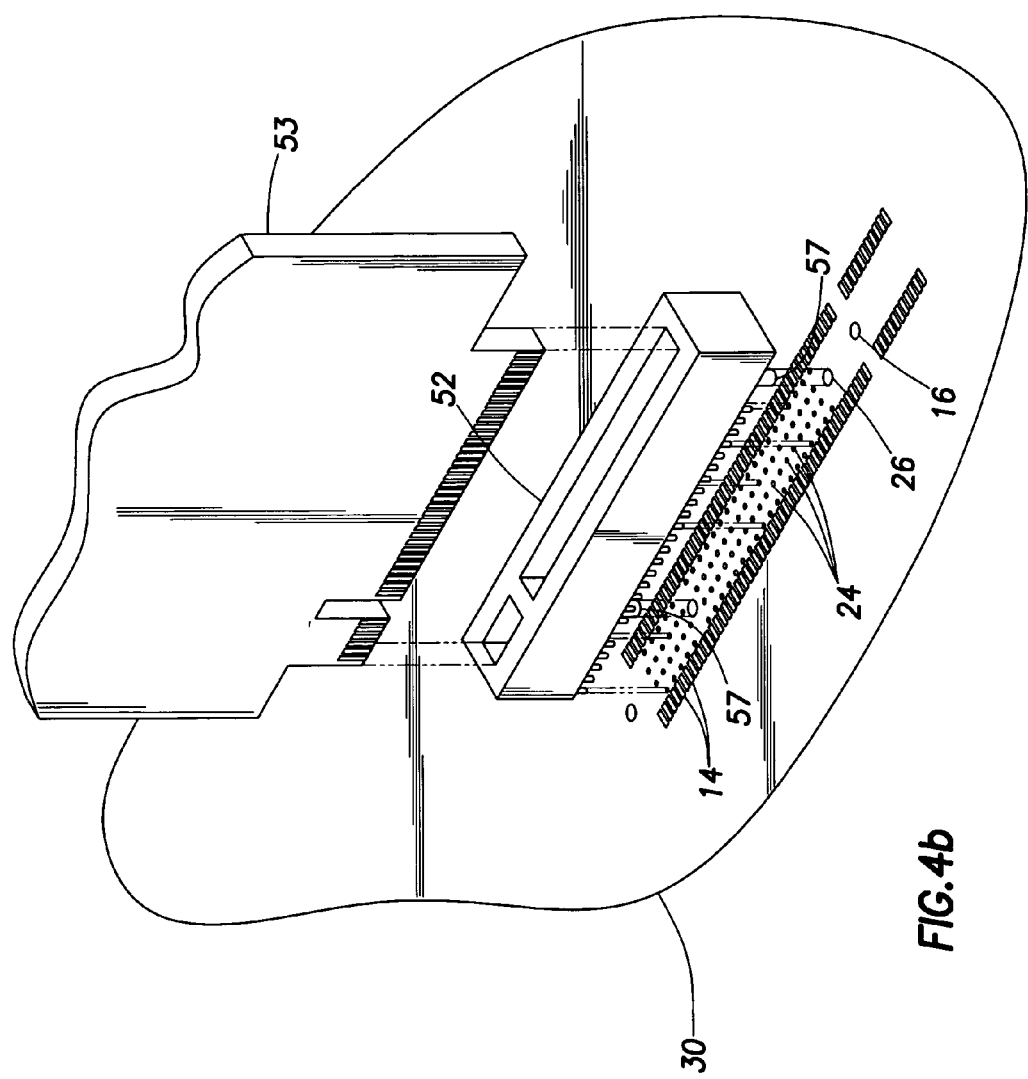

In FIG. 4A, a PCI connector 50 is shown adapted to be electrically coupled to the pattern of electrical connections 14 and a PCI-compatible add-in card 51 is shown adapted to be mated with the PCI connector 50 and thus used in the system in which the board 30 is installed. Alternatively, as shown in FIG. 4B a PCI-Express connector 52 is shown adapted to be electrically coupled to the pattern of electrical connections 24 to permit a PCI-Express-compatible add-in card 53 to be mated to electrical connector 52 and thus used in the system. Moreover, either of two types of add-in cards can be coupled to the circuit board at the location defined by the electrical connections 14 and 24 depending on the type of electrical connector mated to the electrical connections.

In accordance with various embodiments of the invention, two patterns of electrical connections are generally co-located so as to permit either of two types of add-in cards to be installed at that location. In other embodiments, however, three or more patterns of electrical connections can be co-located so as to permit any of three or more types of add-in cards to be installed at that location.

Referring again to FIGS. 1A-4B, each pattern of electrical connectors includes two mounting holes to receive the electrical connectors 50 or 52. In FIG. 1A, the pattern of electrical connections 14 includes a pair of mounting holes 16, while the pattern of electrical connectors 24 in FIG. 1B includes a pair of mounting holes 26. In FIGS. 2-4B, in which two patterns of electrical connections are co-located, both sets of mounting holes 16 and 26 are included as well. The mounting holes are adapted to receive a protruding mechanical support member (e.g., members 55, 57) from the bottom surface of each connector 50, 52. The protruding mechanical members 55, 57 are useful to properly align the electrical connectors 50, 52 and to provide additional mechanical support.

Each location on a circuit board to which an add-in card can be installed is referred to for purposes of this disclosure as a "slot." By co-locating two or more patterns of electrical connections in the same slot, a computer manufacturer can offer considerable flexibility to purchasers or users of its systems. Some purchasers/users may want all of the available slots in a computer to be configured to receive only a specific type of add-in card, while other purchasers may want the slots configured for a different type of add-in card. Further, some purchasers may want one or more slots to be configured to receive a first type of add-in card, and other slots to be configured to receive a second type of add-in card. The embodiments disclosed herein avoid the computer manufacturer from having to develop, test, and produce multiple types of system boards to accommodate the varying needs of its customers. Examples of this flexibility is illustrated in FIGS. 5 and 6A-6C.

In FIG. 5, a system board 60 is shown containing four slots 64, 66, 68, and 70. As shown, slots 64 and 68 include only a single pattern of electrical connections 14 and thus are capable of only receiving a single type of add-in card (e.g., a PCI card). Slots 66 and 70, however, include two patterns of electrical connections 14 and 24 which, as explained above, permit such slots to accommodate either of two types of add-in cards (PCI or PCI-Express). FIG. 5 also shows a PCI and PCI-Express controller 65 provided on the system board 60 and electrically coupled to the slots 64-70. The PCI and PCI-Express controller 65 provides communication between the slots and other logic in the system, such as a central processing unit (CPU) 77. A bus 72 couples the PCI and PCI-Express controller 65 to all four slots 64-70 because all four slots are, or can be, configured to receive a PCI add-in card. Buses 74 and 76 couple the PCI and PCI-Express controller 65 to slots 66 and 70 because only those two slots can also be configured for use by a PCI-Express add-in card. Accordingly, if a user wants to have the ability to populate all four slots 64-70 with PCI cards, a PCI connector 50 (FIG. 4A) can be mated to each of the four slots and specifically to the pattern of electrical connections 14 in each slot. If, however, a user desires to have the ability to populate two of the slots for use by PCI cards and two other slots for use by PCI-Express cards, then PCI connectors 50 can be installed in slot 64 and 68 and PCI-Express connectors 52 can be installed in slot 66 and 70.

In accordance with a variety of techniques, the electronic system into which the add-in cards are installed can be informed of the types of cards that are installed. For example, each add-in card may be provided with that card's configuration type (e.g., PCI, PCI-Express, etc.). The configuration type can be coded into each add-in card by way of one or more resistors connected to pre-defined voltages. Logic in the system can determine which resistors are installed on the card to determine the card type. Alternatively, configuration information can be programmed into non-volatile memory on the add-in card and the configuration information can be read by the host system.

FIG. 6A illustrates a circuit board 80 that includes five slots 84, 86, 88, 90 and 92. A PCI and PCI-Express controller 65 is shown as well as a PCI-Express controller 82. Each controller provides communications to one or more of the slots. Slots 84 and 86, as shown, have been fabricated to include both patterns of electrical connections 14 and 24 and thus can be configured for either of two different types of add-in cards. If PCI connectors 50 are installed in both slots 84 and 86, both such slots can be used to receive a PCI add-in card. If PCI-Express connectors 52 are installed in slots 84 and 86, both such slots can receive a PCI-Express add-in card. Further still, a PCI connector 50 can be installed in slot 84, while a PCI-Express connector 52 can be installed in slot 86, or vice versa. As such, slot 84 can be configured for PCI card usage, while slot 86 can be configured for PCI-Express card usage. The pattern of electrical connections 24 in slot 86 includes more electrical connections than the pattern of electrical connections 24 in slot 84. By increasing the number of electrical connections 24 in slot 86, a PCI-Express card, for example, having a wider data bus can be used than would be possible for slot 84. Slots 88, 90, and 92 are configured for only one type of add-in card. In the exemplary embodiment of FIG. 6A, slot 88 is configured only for PCI card usage and slots 90 and 92 are configured for only PCI-Express card usage.

Figure 6B:
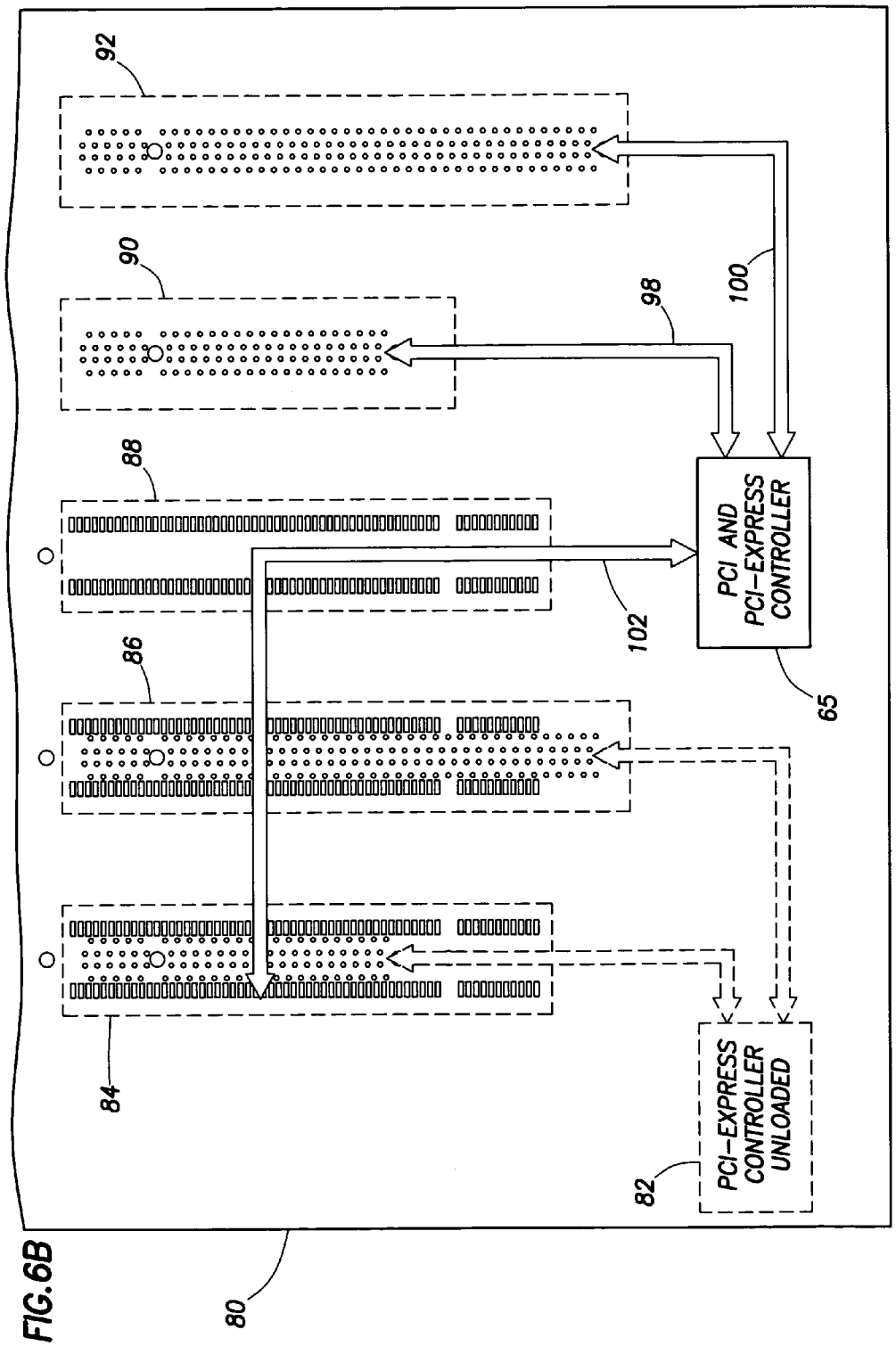

FIG. 6B illustrates that slots 84 and 86 have been configured for PCI card usage, thereby configuring the system to provide capacity for one to three PCI cards. Because neither of slots 84 or 86 is used as PCI-Express slots in the example of FIG. 6B, the PCI-Express controller 82 is not needed. As such, the PCI-Express controller 82 need not be installed on circuit board 80, thereby reducing cost to the purchaser.

Figure 6C:
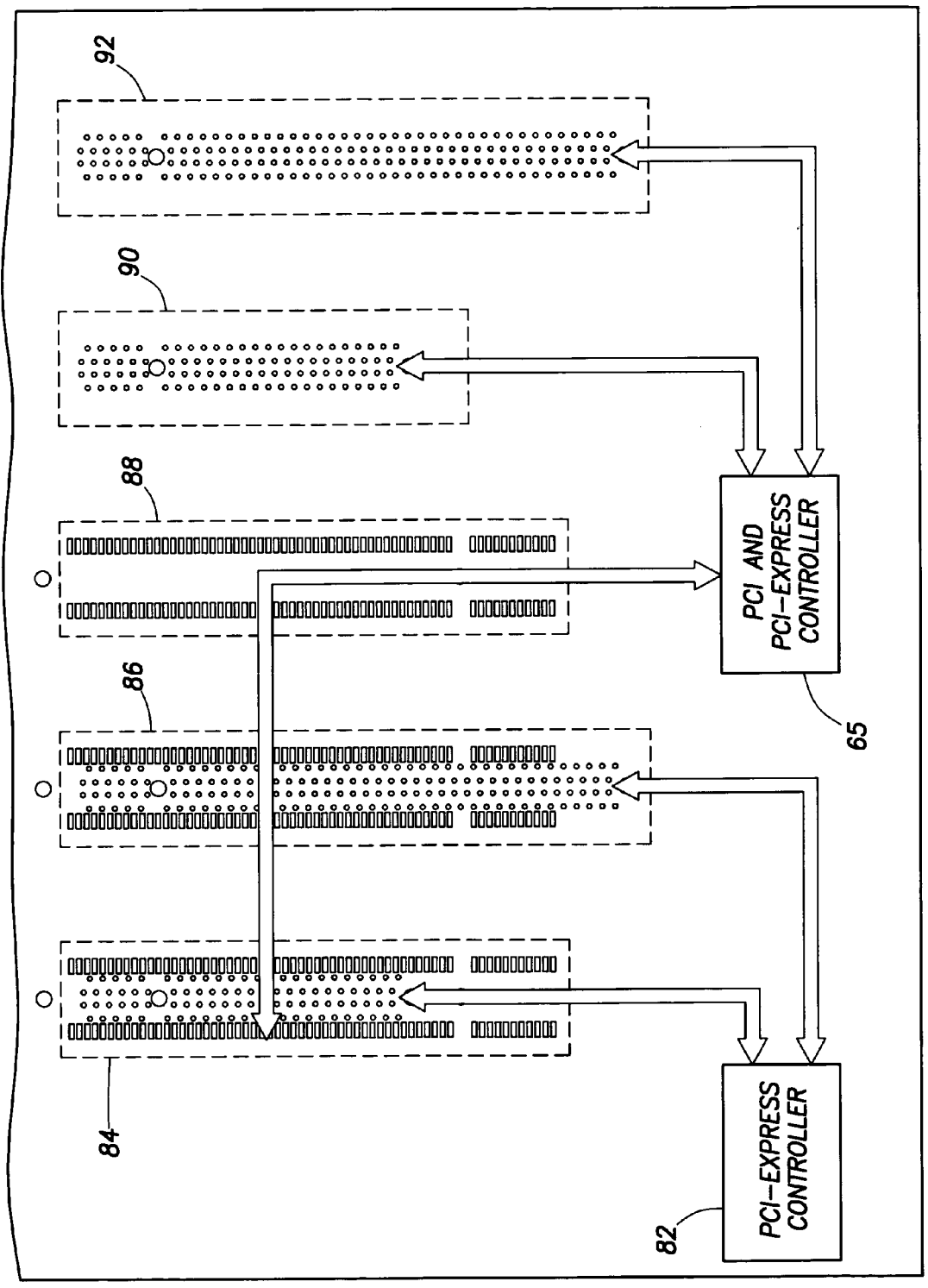

FIG. 6C illustrates that PCI-Express connectors 52 and 54 are installed in slots 84 and 86. As such, slots 84, 86, 90, and 92 are configured to receive PCI-Express cards. Only slot 88 is configured for solely PCI card usage. In the embodiment of FIG. 6C the PCI-Express controller 82 is included to provide electrical connectivity to the PCI-Express-configured slots 84 and 86.

The above discussion is meant to be illustrative of the principles and various embodiments of the present invention. Numerous variations and modifications will become apparent to those skilled in the art once the above disclosure is fully appreciated. For example, the number of slots can be varied from that shown in any of the figures, and the mix of those slots that can be configured for any of two or more types of add-in cards versus the number of slots that can only receive a single type of add-in card can be varied from that shown. In some embodiments all of the slots can include two or more patterns of electrical connections. Further, although each pattern is shown to comprise a plurality of electrical connections, in some embodiments only a single connection to an add-in card may comprise a pattern. It is intended that the following claims be interpreted to embrace all such variations and modifications.

What is claimed is:

1. A circuit board, comprising:
    at least one slot provided on a surface of said circuit board and to which an add-in card can be mated;
    wherein said slot comprises first and second patterns of electrical connections, and said slot comprises a first electrical connection, in said first pattern, adapted to couple to an add-in card of a first type and a second electrical connection, in said second pattern, adapted to couple to an add-in card of a second type, wherein the first and second types are different;
    wherein, for each such slot, the second pattern lies within a footprint defined by the first pattern, and
    wherein the first pattern of electrical connections is configured to receive a first electrical connector and the second pattern of electrical connections is configured to receive a second electrical connector, and wherein the first and second connectors are different types.

2. The circuit board of claim 1 wherein, for each slot, the first electrical connection is configured to receive a first electrical connector and the second electrical connection is configured to receive a second electrical connector, and wherein the first and second electrical connectors are of different types.

3. The circuit board of claim 1 wherein the first pattern of electrical connections comprises two rows of electrical connections defining a space between said rows, and the second pattern of electrical connections lies in said space.

4. The circuit board of claim 1 wherein the first electrical connection comports with one interface standard and the second electrical connection comports with another interface standard.

5. The circuit board of claim 1 wherein said slot further comprises a third electrical connection adapted to couple to an add-in card of a third type.

6. The circuit board of claim 1 wherein the first electrical connection comprises a conductive pad on said surface and the second electrical connection comprises a through hole formed in said circuit board.

7. A system, comprising:
    a circuit board;
    control logic residing on said circuit board;
    a first pattern of electrical contacts coupled to said control logic to receive a first type of add-in card; and
    a second pattern of electrical contacts coupled to said control logic and to receive a second type of add-in card;
    wherein the first and second types of add-in cards each have an electrical interface and the electrical interface of the first type of add-in card is incompatible with the electrical interface of the second type of add-in card; and
    wherein the first and second patterns of electrical contacts are provided within a single slot of said circuit board; and
    wherein the second pattern of contacts defines a footprint that lies within a footprint defined by the first pattern of electrical contacts, and
    wherein each pattern of electrical contacts is adapted to include a connector to which the add-in card can be mated, and wherein the connector for the first pattern is different from the connector for the second pattern.

8. The system of claim 7 wherein at least one pattern comprises a plurality of rows of electrical contacts.

9. The system of claim 8 wherein each of the first and second patterns have rows of electrical contacts and wherein rows of the second pattern of the contacts reformed on said circuit board between rows of the first pattern of the contacts.

10. The system of claim 7 further comprising a plurality of slots coupled to said logic, at least one slot comprising the first and second patterns of electrical contacts.

11. The system of claim 7 further comprising at least one additional slot that comprises at least two patterns of electrical contacts, each pattern adapted to receive an add-in card.

12. The system of claim 10 wherein each pattern is adapted to receive an electrical connector to which an add-in card can be mated, the electrical connector of one pattern in a slot being different from the electrical connector of another pattern in the same slot.

* * * * *